US008823221B1

(12) United States Patent
Teter

(10) Patent No.: US 8,823,221 B1
(45) Date of Patent: Sep. 2, 2014

(54) OPTIMIZED GALFENOL-TYPE MAGNETOSTRICTIVE ACTUATOR

(71) Applicant: The United States of America as represented by the Secretary of the Navy, Washington, DC (US)

(72) Inventor: Joseph P Teter, Darnestown, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 212 days.

(21) Appl. No.: 13/627,218

(22) Filed: Sep. 26, 2012

(51) Int. Cl.
*H02N 2/00* (2006.01)

(52) U.S. Cl.
USPC .............................................. 310/26; 310/30

(58) Field of Classification Search
USPC ......................................... 310/14–15, 23, 26
See application file for complete search history.

(56) References Cited

U.S. PATENT DOCUMENTS

| | | | |
|---|---|---|---|
| 3,932,827 A | | 1/1976 | Buhrer |
| 5,389,845 A | * | 2/1995 | Brimhall ........................ 310/26 |
| 5,585,772 A | * | 12/1996 | Joshi et al. .................... 335/215 |
| 5,663,645 A | | 9/1997 | Kaufman et al. |
| 5,934,129 A | * | 8/1999 | Poloni et al. ................. 72/241.4 |
| 7,218,067 B2 | | 5/2007 | Marioni |
| 7,276,824 B2 | * | 10/2007 | Statnikov et al. ............... 310/26 |
| 7,492,240 B1 | | 2/2009 | Cho et al. |
| 8,416,972 B2 | * | 4/2013 | Aston et al. .................... 381/190 |
| 2002/0039060 A1 | * | 4/2002 | Maruyama .................... 335/220 |
| 2005/0212364 A1 | * | 9/2005 | Ohashi ............................ 310/26 |
| 2007/0081679 A1 | * | 4/2007 | Suzuki et al. ................. 381/152 |

* cited by examiner

*Primary Examiner* — Thanh Lam
(74) *Attorney, Agent, or Firm* — Dave A. Ghatt

(57) ABSTRACT

An apparatus and a method for optimizing a Galfenol-type magnetostriction actuator. The method and apparatus includes an elongated Galfenol-type magnetostrictive bar, first coil and a second coil, orthogonal to the first coil, with the coils arranged and activated to optimize expansion and contraction in the bar. According to the apparatus and the method, the first coil pre-aligns the magnetic moments of the bar into a desired crystallographic orientation that allows for maximum expansion or contraction when under the influence of the magnetic field of the second coil.

7 Claims, 6 Drawing Sheets

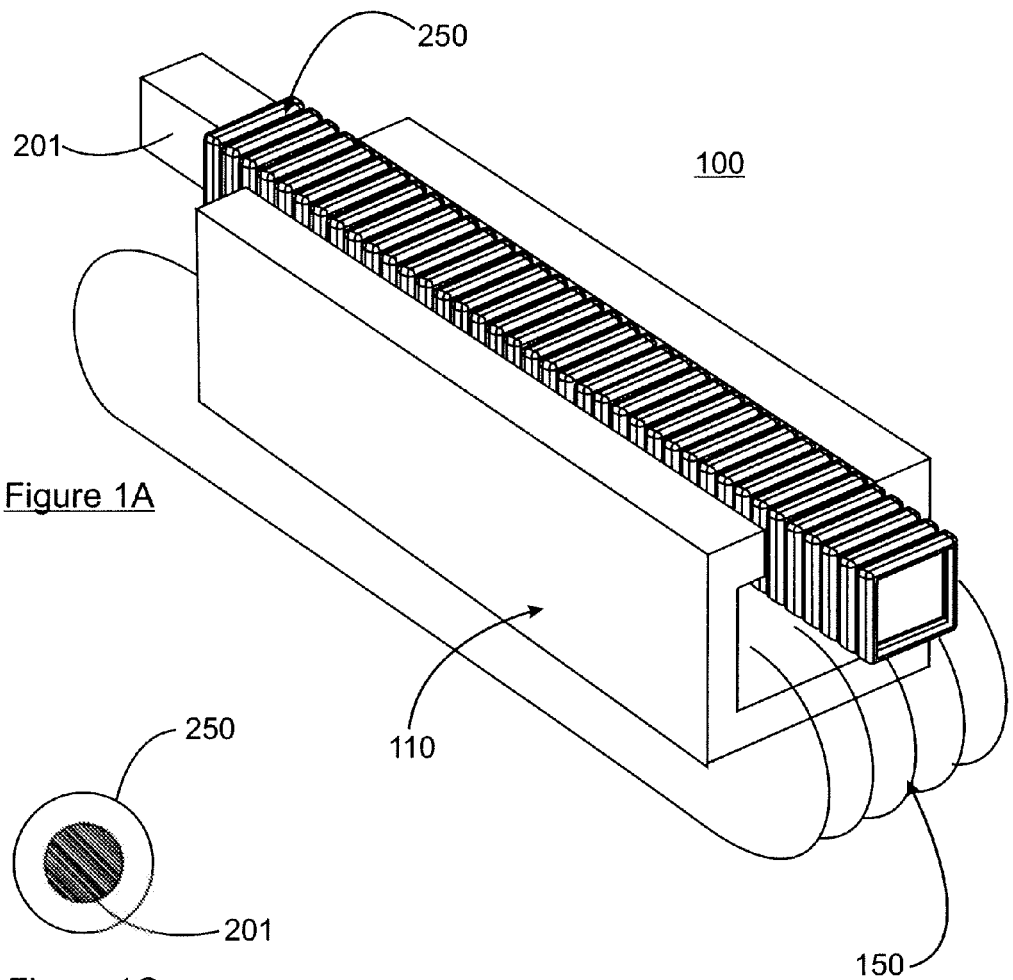
Figure 1A
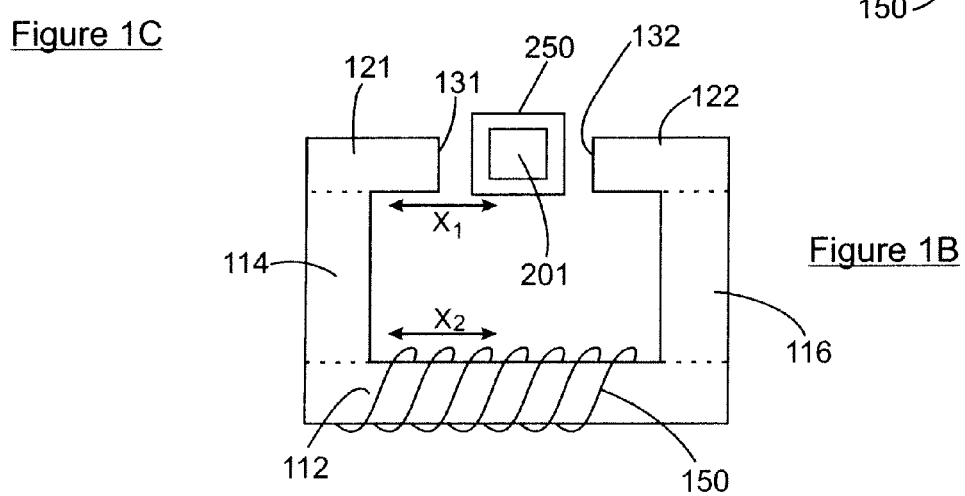
Figure 1C
Figure 1B

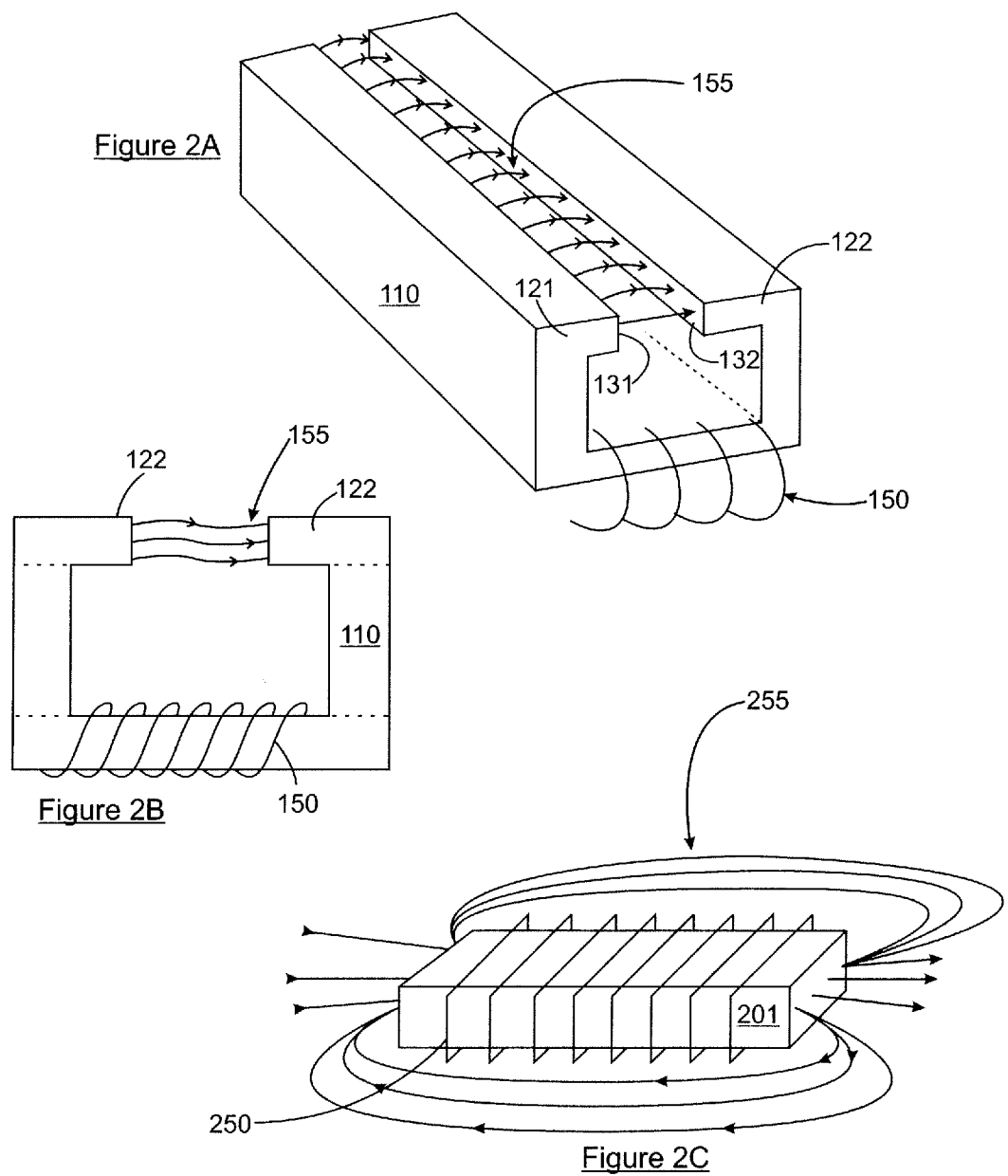

OPTIMIZED GALFENOL-TYPE MAGNETOSTRICTIVE ACTUATOR

STATEMENT OF GOVERNMENT INTEREST

The following description was made in the performance of official duties by employees of the Department of the Navy, and, thus the claimed invention may be manufactured, used, licensed by or for the United States Government for governmental purposes without the payment of any royalties thereon.

TECHNICAL FIELD

The following description relates generally to an apparatus and a method for optimizing a magnetostriction actuator. The method and apparatus includes an elongated magnetostrictive bar, first coil and a second coil orthogonal to the first, with the coils arranged and activated to optimize contraction and expansion in the bar.

BACKGROUND

Magnetostrictive actuators are devices in which materials that undergo magnetostriction are used to produce an output strain in response to a magnetic driving force. Magnetostriction is the name given to the process whereby some materials alter their physical dimensions when a magnetic field is applied to them. Thus these materials offer the opportunity to convert electrical energy into mechanical energy.

By doping iron with gallium, U.S. Navy researchers created Galfenol, a material that has enhanced magnetostrictive properties. The added gallium enhanced iron's magnetostrictive capability tenfold. The addition of gallium to the iron changes the structure of the iron, which on an atomic level forms a lattice of regular cubic cells. When the gallium combines with the iron, the faces of some of the cells become rectangular rather than square. These elongated gallium-iron cells then congregate into tiny clumps within the lattice. These clusters of distorted cells respond to a magnetic field by rotating their magnetic moments, like tiny compass needles.

The prior art does not teach a method or apparatus that optimizes Galfenol-type magnetostrictive actuators. The prior art U.S. Pat. No. 7,218,067 (the '067 patent) teaches an arrangement including orthogonal coils. However the coils are not arranged in a manner that optimizes the magnetic moments available in Galfenol-type magnetostrictive actuators. FIG. 6A is an explanatory illustration of the teaching of the '067 patent. As shown in FIG. 6A, the '067 patent arrangement includes first and second orthogonally positioned coils 410 and 420 surrounding a magnetic field-actuated material 450. As shown, the coils (410, 420) have a diameter d, and the material 450 has a length l. FIG. 6A also shows a dashed circle 401 illustrating the localized magnetic field, according to the '067 patent. Thus, '067 patent produces only a localized field, and does not affect the entire length of the magnetic field-actuated material 450. Thus in working conditions, only those portions of the material 450 within the vicinity of the localized magnetic field would be influenced by the field. Consequently, the FIG. 4A arrangement does not optimize the use of the entire length of the material 450.

FIG. 6B shows a possible arrangement based on the '067 patent, in which the entire material 450 is influenced by the magnetic field. As shown, this is achieved by having orthogonal coils 430 and 440 having an increased diameter D with respect to the material 450 having a length l, as stated above. According to the arrangement in FIG. 4B, the magnetic flux generated engulfs the magnetic field-actuated material 450. FIG. 4B also shows a dashed circle 403 representing the localized magnetic flux generated by the coils 430 and 440. As shown this area extends well outside the bounds of the material 450, which is extremely inefficient, resulting in a low strength magnetic field acting on the material 450. Consequently, it is desired to have an arrangement that optimizes the magnetic moments available in Galfenol-type magnetostrictive actuators, in an energy efficient manner.

SUMMARY

In one aspect, the invention is an apparatus for optimizing a Galfenol-type magnetostrictive actuator. The apparatus includes an elongated Galfenol-type magnetostrictive bar. The apparatus also includes an elongated ferrous frame having a rectangular section. The rectangular section has a bottom plate region, a first side plate region, a second side plate region, and a top plate region. In this aspect, the top plate region has a first projecting portion extending laterally from a top portion of the first side plate, and a second projecting portion extending laterally from a top portion of the second side plate, wherein each of the first and second projecting portions extend towards each other in a direction substantially parallel to the bottom plate region. According to the invention, the first and second projecting portions do not meet, thereby leaving a gap between the first and second projecting portions, with the elongated magnetostrictive bar extending within the gap. The apparatus for optimizing a magnetostrictive actuator also includes a first electrical coil looping around the bottom plate region of the elongated ferrous frame, and a second electrical coil, orthogonal to the first coil, looping around the elongated Galfenol-type magnetostrictive bar within the gap. The apparatus further includes a controller for controlling the power in each of the first and the second electrical coils.

In another aspect, the invention is a method for optimizing the performance of a Galfenol-type magnetostrictive actuator. According to the invention, the method includes the providing of an elongated Galfenol-type magnetostrictive bar. The method further includes the providing of an elongated ferrous frame having a rectangular section. In this aspect, the rectangular section includes a bottom plate region, a first side plate region, a second side plate region, and a top plate region. The top plate region includes a first projecting portion extending laterally from a top portion of the first side plate region, and a second projecting portion extending laterally from a top portion of the second side plate region. Each of the first and second projecting portions extend towards each other in a direction substantially parallel to the bottom plate section, and the first and second projecting portions do not meet, thereby leaving a gap between the first and second projecting portions. According to this method, the elongated Galfenol-type magnetostrictive bar extends within the gap. According to the invention, the method further includes the providing of a first electrical coil looping around the bottom plate section of the elongated ferrous frame, and the providing of a second electrical coil, orthogonal to the first coil, looping around the elongated Galfenol-type magnetostrictive bar within the gap. The method further includes rotating the magnetic moments of the elongated Galfenol-type magnetostrictive bar in a in a pre-aligned Y-direction by powering the second coil to extend a high strength magnetic field longitudinally within the gap along substantially the entire length of the Galfenol-type elongated magnetostrictive bar. According to the method, after rotating the magnetic moments in the pre-aligned Y-direction, the magnetic moments along substantially the entire length of the Galfenol-type elongated magnetostrictive bar are rotated in a Z-direction substantially perpendicular to the Y-direction by powering the first coil to extend a high strength magnetic field axially within the gap along substantially the entire length of the Galfenol-type elongated magnetostrictive bar, thereby optimizing the performance of the magnetostrictive actuator.

BRIEF DESCRIPTION OF THE DRAWINGS

Other features will be apparent from the description, the drawings, and the claims.

FIG. 1A is an exemplary illustration of an arrangement for optimizing a Galfenol-type magnetostrictive actuator, according to an embodiment of the invention.

FIG. 1B is an exemplary sectional illustration of an arrangement for optimizing a Galfenol-type magnetostrictive actuator, according to an embodiment of the invention.

FIG. 1C is an exemplary illustration of a magnetostrictive bar and complementary coil, according to an embodiment of the invention.

FIG. 2A is an exemplary illustration of the magnetic flux created by the activation of the first coil, according to an embodiment of the invention.

FIG. 2B is an exemplary illustration of the magnetic flux created by the activation of the first coil, according to an embodiment of the invention.

FIG. 2C is an exemplary illustration of the magnetic flux created by the activation of the second coil, according to an embodiment of the invention.

DETAILED DESCRIPTION

Figure 3A:
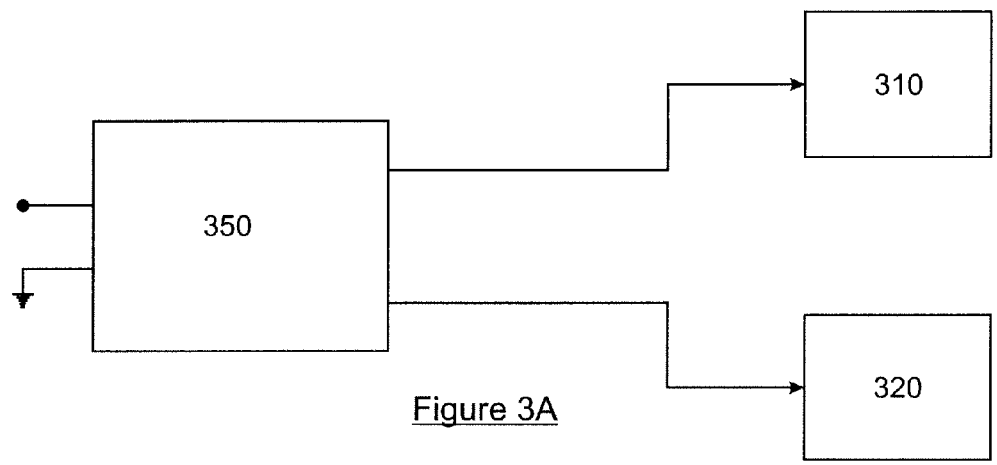
FIG. 3A is an exemplary illustration of the control arrangement for powering the coils, according to an embodiment of the invention.

FIG. 1A is an exemplary perspective illustration of an arrangement 100 for optimizing a Galfenol-type magnetostrictive actuator, according to an embodiment of the invention. According to the invention, the term "Galfenol-type" refers to Galfenol alloys having enhanced magnetostrictive properties, such as Galfenol, or Galfenol alloys having one or more additives such as aluminum, boron, or carbon.

As stated above, FIG. 1A shows the arrangement 100 for optimizing a Galfenol-type magnetostrictive actuator. As shown the arrangement 100 includes an elongated ferrous frame 110 having a substantially rectangular section. Ferrous frame materials can consist of nickel steel, silicon steel or, amorphous metallic alloys. FIG. 1B is an exemplary sectional illustration of the arrangement 100 showing the substantially rectangular section, and the different regions of that rectangular section. As shown in FIG. 1B, the rectangular section of the elongated ferrous frame 110 includes a bottom plate region 112, a first side plate region 114, and a second side plate region 116. FIG. 2B also shows a top plate region 118, which includes a first projecting portion 121 extending laterally from a top portion of the first side plate 114, and a second projecting portion 122 extending laterally from a top portion of the second side plate 116. As shown, each of the first and second projecting portions (121, 122) extend towards each other as shown by double headed arrow $X_1$, which is substantially parallel to the direction of extension of the bottom plate section 112, shown by double headed arrow. It should be noted that the dotted lines are imaginary lines that demarcate the regions 112, 114, 116, and 118 outlined above.

As shown in FIG. 1B, the first and second projecting portions 121 and 122 do not meet, thereby leaving a gap 125. As shown in FIG. 1B, the first and second projecting portions 121 and 122 have leading edges 131 and 132, respectively. The leading edges 131 and 132 may be substantially perpendicular to the direction of the double headed arrow $X_1$. As shown in FIG. 1A, the gap 125 has a substantially constant width along the length of the ferrous frame 110. As shown in FIGS. 1A and 1B, an elongated magnetostrictive bar 201 extends in the gap 125. According to an embodiment of the invention, the elongated magnetostrictive bar 201 is a Galfenol-type bar. As shown, the bar 201 has a rectangular section. FIGS. 1A and 1B also show the bar 201 being surrounded by a coil 250, which has a complementary rectangular section. It should be noted that the bar 201 is supported within the coil 250 in such a manner that allows the bar 201 to freely expand when under the influence of an imposed magnetic flux, as outlined below. Although FIGS. 1A and 1B show the bar 201 and the coil 250 having rectangular cross sections, the bar and coil may have other shapes. For example, FIG. 1C shows a bar 201, which as outlined above may be a Galfenol-type magnetostrictive bar, having a circular cross section, and the coil 250 having a complementary circular cross section.

Returning to FIGS. 1A and 1B, as shown, the arrangement 100 for optimizing a Galfenol-type magnetostrictive actuator, having a first coil 150 wrapped around the bottom plate region 112 of the elongated ferrous frame 110. As illustrated, the first coil 150 is oriented orthogonal to the second coil 250, which surrounds the bar 201. As outlined below, this orthogonal orientation of the first coil 150 with respect to the second coil 250 allows for optimized contraction and expansion of the bar 201. Each of the first and second coils 150 and 250 may have any desired number of coil turns.

FIGS. 2A and 2B are exemplary illustrations of the magnetic flux created by the activation of the first coil 150, according to an embodiment of the invention. Due to the shape and also the composition of the elongated ferrous fame 110, the magnetic flux 155 extends directly into the gap 125 between the first and second projecting portions 121 and 122, between the leading edges 131 and 132. FIG. 2B shows the flux extending evenly along the entire length of the frame 110. Consequently, when the elongated magnetostrictive bar 201 is positioned within the gap 125 as shown in FIGS. 1A and 1B, the flux 155 extends axially with respect to the bar 201, and substantially the entire length of the bar 201 comes under the influence of the flux 155. Thus the instant design optimizes the delivery of the magnetic flux to the bar 201, substantially eliminating energy losses.

FIG. 2C is an exemplary illustration of the magnetic flux created by the activation of the second coil 250. As shown, the second coil 250 surrounds the bar 201. When the second coil 250 is activated, the flux 255 is produced. The direction of the flux 255 is substantially perpendicular to the direction of the flux 155. As shown the flux 255 extends longitudinally through the bar 201, tightly curling back above the bar 201, as the flux lines go from one end of the bar to another. Again here, the flux runs along the entire length of the bar 201.

Thus, the optimization here is twofold. First, there is optimization because the arrangement allows for maximum contraction and expansion. Because the axial and longitudinal magnetic fields 155 and 255, respectively, created by the coils 150 and 250 extend along the entire length of the bar 201, maximum contraction and expansion can be achieved because the entire bar 201 is subject to the orthogonal fields. Second optimization is due to energy efficiency. As shown, a majority of the fields 155 and 255 produced by the first coil and second coils 150 and 250 respectively, is directed into the bar as opposed to external to the bar. Regarding the second coil 250, although a portion of the field 255 is external to the bar 201, a majority of the field flows through the bar 201, and the field is generally close to the bar. Consequently, little energy is wasted in the field acting outside the bar 201, that thus the field acting on the bar 201 is a high strength field. This coil arrangement can generate an effective magnetic of up to 2000 gauss in each coil.

Figure 3B:
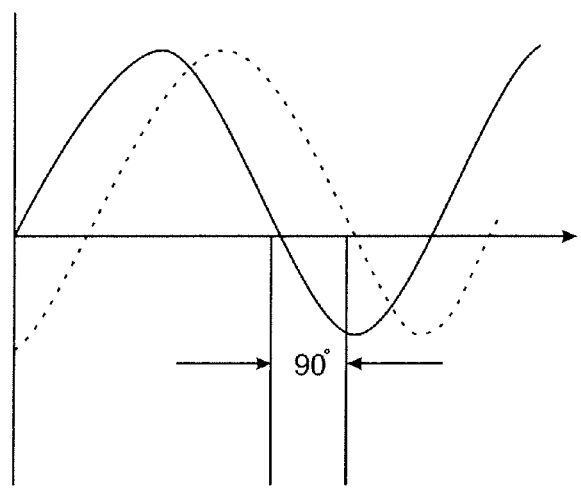
FIG. 3B is an exemplary illustration of the power sequencing of the coils, according to an embodiment of the invention.

FIG. 3A is an exemplary illustration of the control arrangement 300 for powering the coils, according to an embodiment of the invention. The arrangement includes a power supply control 350 for delivering an alternating current to first and second coil circuits 310 and 320. The first and the second coil circuits may be the equivalent of an AC powered inductor circuit in which power is supplied sinusoidally. The power supply control 350 may be a power sequencing arrangement including a sequencing logic circuit. FIG. 3B is an exemplary illustration of the power sequencing of the coils, according to an embodiment of the invention. FIG. 3B shows the power supplies to the first and second coil circuits 310 and 320 having a 90 degree phase difference, with the power supplied to the second circuit 320 first. FIG. 3B shows the power supply to the second coil circuit 320 in a solid line and the power supply to the first coil circuit 310 in a dashed line. As outlined below, by supplying the second coil circuit 320 first, the second coil 250 is energized, thereby producing a magnetic field that rotates magnetic moments of the elongated magnetostrictive bar 201 in a desired substantially uniform direction. This is done prior to the bar 201 being subjected to the magnetic field of the first coil 150, when the first coil 150 is energized according to the predetermined sequencing, as shown in FIG. 3B.

Figure 4A:
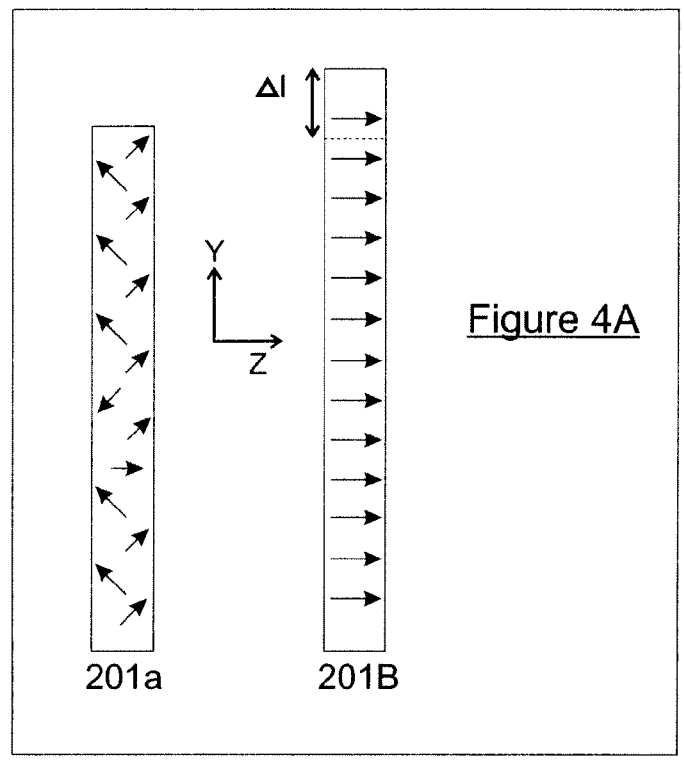
FIG. 4A is an explanatory illustration of the elongated magnetostrictive bar showing magnetic moments and resulting contraction/expansion under an arrangement in which only one coil is used.
Figure 4B:
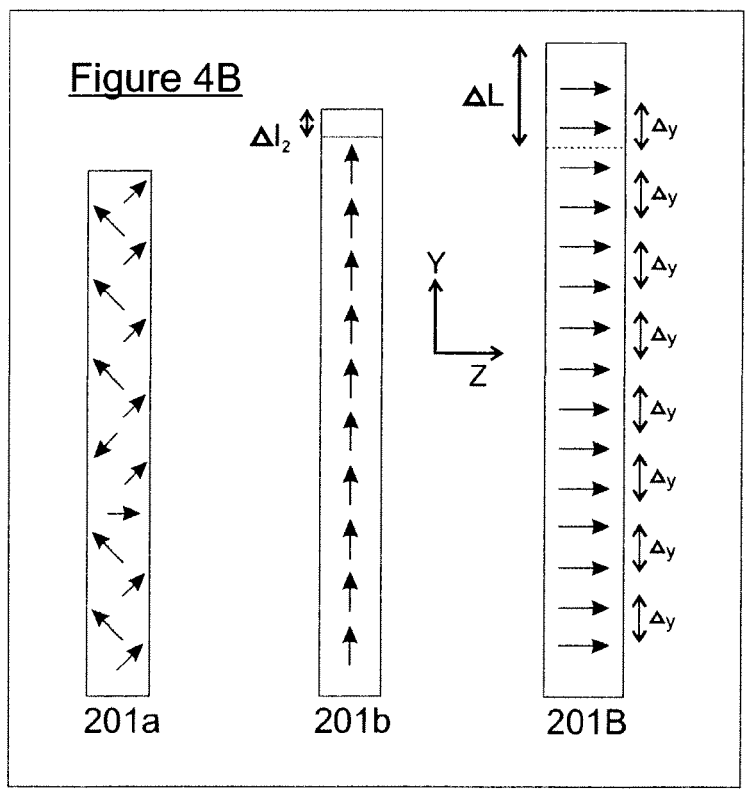
FIG. 4B is an explanatory illustration of the elongated magnetostrictive bar showing magnetic moments and resulting optimized contraction/expansion by using the first and second coils, according to an embodiment of the invention.

As stated above, according to an embodiment of the invention, the elongated magnetostrictive bar 201 is a Galfenol-type bar. The arrangement 100, shown in FIGS. 1A and 1B, utilizes the first and second orthogonal coils 150 and 250 and the characteristics of the Galfenol-type magnetostrictive material to optimize the expansion and contraction in the actuator. In Galfenol-type magnetostrictive materials, gallium-iron cells congregate into tiny clumps within the lattice. These clusters of distorted cells respond to a magnetic field by rotating their magnetic moments, like tiny compass needles. FIG. 4A is an explanatory illustration of the elongated magnetostrictive bar 201 showing magnetic moments and resulting contraction/expansion under an arrangement in which only the first coil 150 is used. FIG. 4B is an explanatory illustration of the elongated magnetostrictive bar showing magnetic moments and resulting optimized contraction/expansion by using the first coil 150 and second coil 250, positioned orthogonal to the first coil 150, according to the embodiment of the invention shown in FIGS. 1A and 1B.

FIG. 4A shows the Galfenol-type bar $201_a$ with typical randomly oriented magnetic moments. The bar 201A in FIG. 4A shows the orientation of the magnetic moments, substantially in a direction Z, after the bar $201_a$ is subjected to a magnetic field such as the field produced by the first coil 150 is directed towards the bar $201_a$. As shown, Δl represents the expansion/contraction of the bar on account of the bar being subjected to the magnetic field of the first coil. The Δl value results from the cumulative effect of the change in magnetic moments from position of the magnetic moments shown in bar $201_a$ to the position shown in the bar $201_A$ after being subjected to the magnetic field.

As stated above, FIG. 4B shows the changes in the bar 201, according to the embodiment of the invention shown in FIGS. 1A and 1B. The bar $201_b$ in FIG. 4A shows the orientation of the magnetic moments, substantially in a direction Y, after the bar $201_a$ is subjected to the magnetic field of the coil 250. This pre-alignment may produce a Δl2 that may be of a similar order to that of Δl shown in FIG. 4A. The Y direction orientation of the magnetic moments is the preferred pre-aligned orientation achieved by energizing the second coil 250, i.e., an optimal crystallographic orientation is achieved. FIG. 4B then shows the Galfenol-type bar $201_B$ with the magnetic moments rotated in a substantially perpendicular Z direction. This rotation is achieved by energizing the first coil 150, which is done subsequent to the activation of the second coil 250. As shown in the bar $201_B$, ΔL represents the expansion/contraction of the bar on account of the bar being subjected to the magnetic field of the first coil 150. The ΔL value results from the cumulative effect of the change in magnetic moments from the Y direction illustrated in $201_b$ to the Z direction shown in $201_B$. The ΔL value is optimized by cumulative effect of the 90 degree rotation of the pre-aligned moments in $201_b$ to the position shown in $201_{13}$.

Additionally as shown in FIG. 4B, and as outlined above, with respect to FIGS. 2A-2C, the ΔL value is further optimized because of the arrangement in which the magnetic fields 155 and 255 act along the entire length of the bar 201, thereby allowing for miniature expansions/contractions ΔY along the entire length of the bar $201_B$. The ΔL value is the resulting cumulative effect of these ΔY values along the length of the bar 201. The arrangement is additionally optimized because most of the magnetic fields 155 and 255 is directed within the bar 201, as opposed to external to bar 201, thereby reducing energy losses.

In operation, the arrangement 100 optimizes a Galfenol-type magnetostrictive actuator by maximizing the expansion and contraction of the Galfenol-type bar 201. As shown, the bar 201 is positioned in the gap 125 in the top plate region of the elongated ferrous frame 110. The arrangement includes first and second orthogonally oriented coils (150, 250), the first coil wrapped around the bottom plate region of the frame 110, and the second coil encompassing the bar 201. The coils are sequentially activated, with a 90 degree phase difference, as outlined with respect to the illustrations of FIGS. 3A and 3B. As outlined above, the second coil 250 is energized first, with the field 255 acting along the entire length of the bar 201, causing the magnetic moments in the bar 201 to align in the Y direction as shown in FIG. 4B. The first coil is then energized, with the field 155 acting along the entire length of the bar, causing the magnetic moments in the bar 201 to align in the Z direction, maximizing the ΔL value by allowing for miniature ΔY changes along the entire length of the bar 201. These design features all combine to optimize the Galfenol-type magnetostrictive actuator.

As shown in FIG. 3B, continuous alternating currents are provided to the first and second coils (150, 250). Because the power supply to each coil is changing sinusoidally, the magnetic field produced also changes sinusoidally. Consequently, the bar 201 is subjected to the changing fields of both the first and second coils (150, 250), and depending on the direction of the current, and the resulting magnetic flux, the bar 201 either contracts or expands. FIG. 3B also shows that the power to the first coil lags the power to the second coil 250 by 90 degrees, the magnetic flux from the second coil always pre aligns the magnetic moments in the bar 201 in a desired crystallographic orientation that optimizes either the expansion or contraction of the bar 201.

Figure 5:
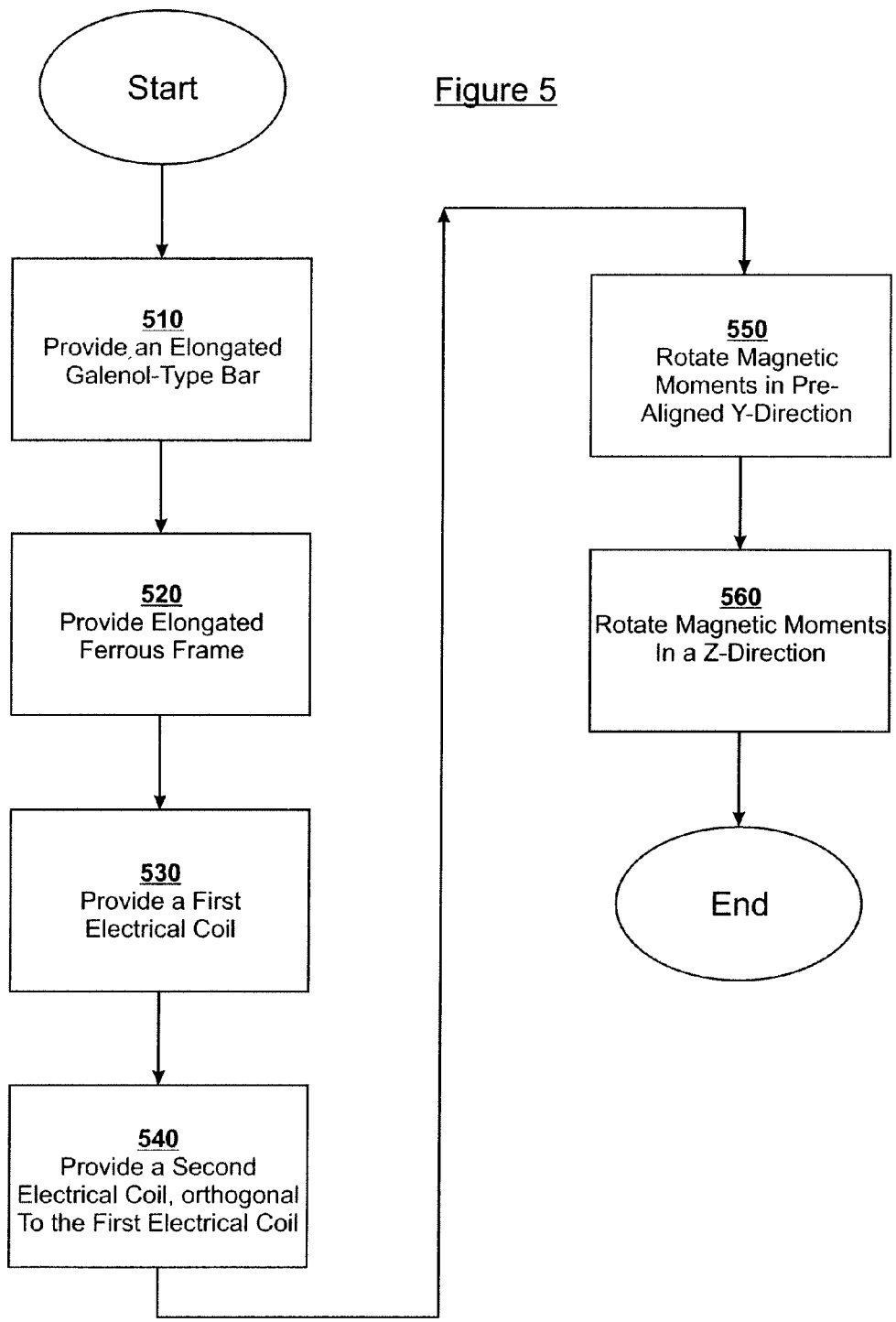
FIG. 5 is a flowchart showing a method for optimizing the performance of a magnetostrictive actuator, according to an embodiment of the invention.
Figure 6A:
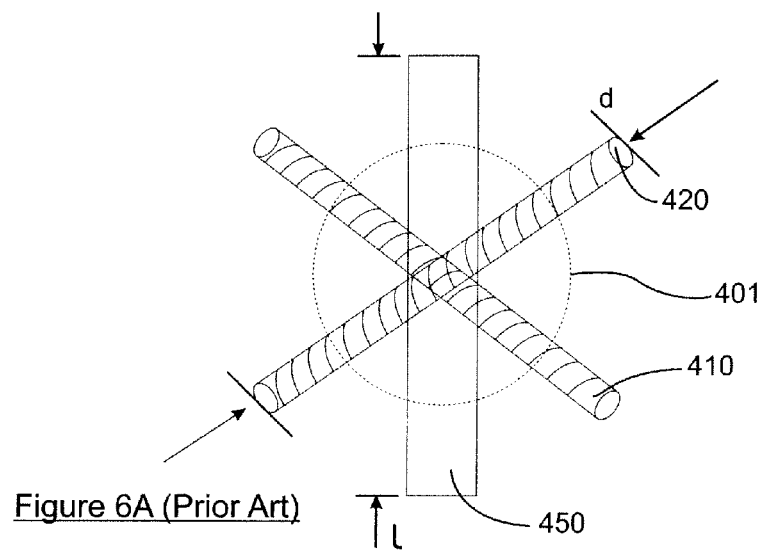
FIG. 6A is an explanatory illustration of a prior art magnetic actuator.
Figure 6B:
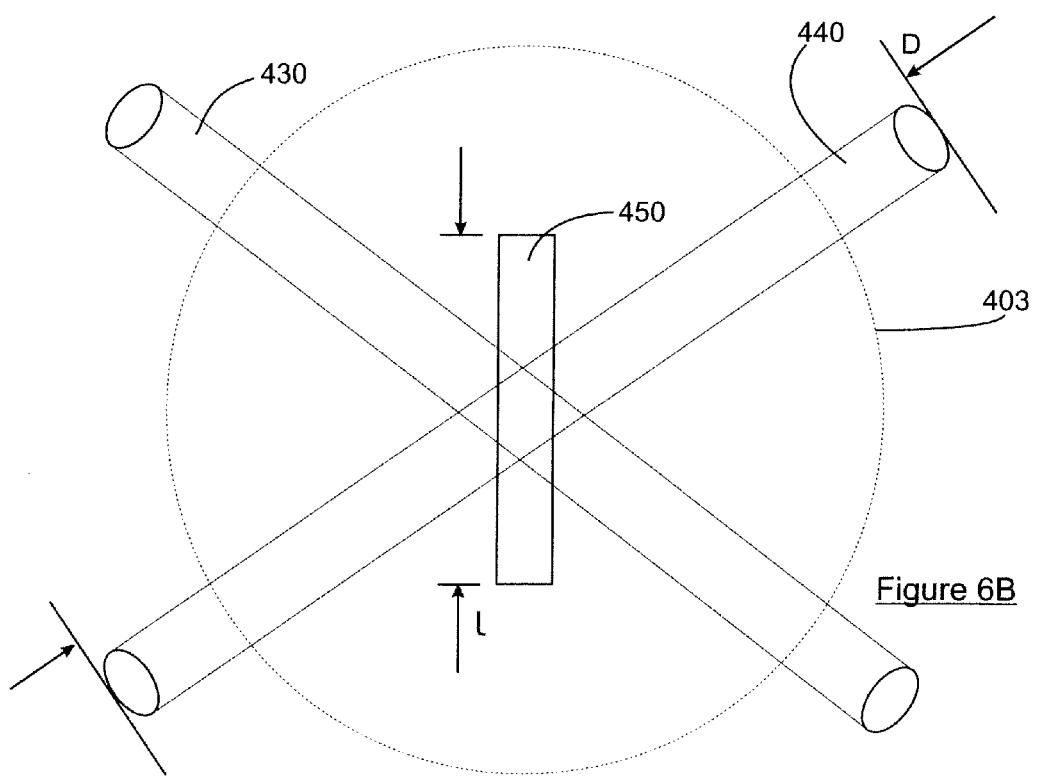
FIG. 6B is an explanatory illustration of a possible magnetic actuator.

FIG. 5 is a flowchart illustrating a method 500 of optimizing the performance of a Galfenol-type magnetostrictive actuator according to an embodiment of the invention. The steps involved in the method 500 of steam reforming have been outlined above in detail in the description with respect to FIGS. 1A-4B. FIG. 5 merely provides a broad overview of the method 500. For example, according to the method, step 510 is the providing of an elongated Galfenol-type magnetostrictive bar 201, which is shown in FIG. 1A. Step 520 is the providing an elongated ferrous frame 110 having a rectangular section, also shown in FIG. 1A. The rectangular section has a bottom plate region 112, a first side plate region 114, a second side plate region 116, and a top plate region 118. The top plate region 118 has a first projecting portion 121 extending laterally from a top portion of the first side plate, and a second projecting portion 122 extending laterally from a top portion of the second side plate, wherein each of the first and second projecting portions extend towards each other in a direction substantially parallel to the bottom plate section, and wherein the first and second projecting portions do not meet, thereby leaving a gap 125 between the first and second projecting portions (121, 122). According to the method 500, the elongated magnetostrictive bar 201 extends within the gap 125.

The method 500 also includes the step 530 of providing a first electrical coil 150 looping around the bottom plate section 112 of the elongated ferrous frame 110. Step 540 is the providing of a second electrical coil 250, orthogonal to the first coil 150, looping around the elongated Galfenol-type magnetostrictive bar 201 within the gap 125. The method also includes step 550, which is the rotating of the magnetic moments along substantially the entire length of the Galfenol-type elongated magnetostrictive bar 201 in a pre-aligned Y-direction by powering the second electrical coil 250 to extend a high strength magnetic field longitudinally within the gap 125 along substantially the entire length of the Galfenol-type elongated magnetostrictive bar 201. Step 560 is performed after rotating the magnetic moments in the pre-aligned Y-direction and includes the rotating of the magnetic moments along substantially the entire length of the Galfenol-type elongated magnetostrictive bar 201 in a Z-direction substantially perpendicular to the Y-direction. This is done by powering the first electrical coil 250 to extend a high strength magnetic field axially within the gap 125 along substantially the entire length of the Galfenol-type elongated magnetostrictive bar 201. By completing these steps, the method 500 optimizes extension or contraction in the Galfenol-type elongated magnetostrictive bar 201, thereby optimizing the performance of the magnetostrictive actuator.

What has been described and illustrated herein are preferred embodiments of the invention along with some variations. The terms, descriptions and figures used herein are set forth by way of illustration only and are not meant as limitations. For example, the term "Galfenol-type" refers to Galfenol alloys having enhanced magnetostrictive properties, such as Galfenol, or Galfenol alloys having one or more additives such as aluminum, boron, or carbon. However, other alloys having enhanced magnetostrictive properties, similar to the properties of Galfenol, may be used in the actuator. Those skilled in the art will recognize that many variations are possible within the spirit and scope of the invention, which is intended to be defined by the following claims and their equivalents, in which all terms are meant in their broadest reasonable sense unless otherwise indicated.

What is claimed is:

1. An apparatus for optimizing a magnetostrictive actuator, the apparatus comprising:
    a Galfenol-type elongated magnetostrictive bar;
    an elongated ferrous frame having a rectangular section, the rectangular section comprising;
        a bottom plate region,
        a first side plate region,
        a second side plate region, and
        a top plate region comprising,
            a first projecting portion extending laterally from a top portion of the first side plate, and
            a second projecting portion extending laterally from a top portion of the second side plate, wherein each of the first and second projecting portions extend towards each other in a direction substantially parallel to the bottom plate region, wherein the first and second projecting portions do not meet, thereby leaving a gap between the first and second projecting portions, the Galfenol-type elongated magnetostrictive bar extending within the gap,
    a first electrical coil looping around the bottom plate region of the elongated ferrous frame, so that when the first electrical coil is actuated a high strength magnetic field extends axially across the gap along substantially the entire length of the Galfenol-type elongated magnetostrictive bar;
    a second electrical coil, orthogonal to the first coil, looping around the Galfenol-type elongated magnetostrictive bar within the gap, so that when the second electrical coil is actuated a high strength magnetic field extends longitudinally within the gap along substantially the entire length of the Galfenol-type elongated magnetostrictive bar; and
    a controller for actuating each of the first and the second electrical coils.

2. The apparatus of claim 1, wherein the controller includes a circuit that alternatingly powers by means of a 90 degree phase difference, each of the first and the second coils, wherein the second coil is powered first, followed by the powering of the first coil, wherein the powering of the second coil rotates magnetic moments along substantially the entire length of the Galfenol-type elongated magnetostrictive bar into a pre-aligned Y-direction, so that when the first coil is powered, the magnetic moments along substantially the entire length of the Galfenol-type are rotated into a Z-direction substantially perpendicular to the pre-aligned Y-direction thereby producing an optimized extension or contraction.

3. The apparatus of claim 2, wherein the Galfenol-type elongated magnetostrictive has a rectangular cross section, wherein the second coil has a rectangular cross section commensurate with the cross section of the magnetostrictive bar.

4. The apparatus of claim 3, wherein in the top plate section each of the first projecting portion and the second projecting portion have flat edges that extend substantially parallel to each other and perpendicular to the bottom plate section.

5. A method for optimizing the performance of a magnetostrictive actuator, the method comprising:
    providing a Galfenol-type elongated magnetostrictive bar;

providing an elongated ferrous frame having a rectangular section, the rectangular section comprising:
  a bottom plate region;
  a first side plate region;
  a second side plate region; and
  a top plate region comprising;
    a first projecting portion extending laterally from a top portion of the first side plate, and
    a second projecting portion extending laterally from a top portion of the second side plate, wherein each of the first and second projecting portions extend towards each other in a direction substantially parallel to the bottom plate region, wherein the first and second projecting portions do not meet, thereby leaving a gap between the first and second projecting portions, the Galfenol-type elongated magnetostrictive bar extending within the gap,
providing a first electrical coil looping around the bottom plate region of the elongated ferrous frame;
providing a second electrical coil, orthogonal to the first coil, looping around the Galfenol-type elongated magnetostrictive bar within the gap;
rotating the magnetic moments along substantially the entire length of the Galfenol-type elongated magnetostrictive bar in a pre-aligned Y-direction by powering the second coil to extend a high strength magnetic field longitudinally within the gap along substantially the entire length of the Galfenol-type elongated magnetostrictive bar;
after rotating the magnetic moments in the pre-aligned Y-direction, rotating the magnetic moments along substantially the entire length of the Galfenol-type elongated magnetostrictive bar in a Z-direction substantially perpendicular to the Y-direction by powering the first coil to extend a high strength magnetic field axially within the gap along substantially the entire length of the Galfenol-type elongated magnetostrictive bar thereby optimizing extension or contraction in the Galfenol-type elongated magnetostrictive bar, thereby optimizing the performance of the magnetostrictive actuator.

6. The method of claim 5 further comprising, providing a controller for controlling the timing of the power to each of the first and the second electrical coils, wherein the controller includes a circuit that synchronizes the power supply by alternatingly the power to the first and second coils by means of a 90 degree phase difference.

7. The method of claim 6 wherein the Galfenol-type elongated magnetostrictive bar is provided with a rectangular cross section, and wherein the second coil is provided a rectangular cross section commensurate with the cross section of the Galfenol-type elongated magnetostrictive bar.

* * * * *